United States Patent [19]

Manasevit

[11] 3,922,475

[45] Nov. 25, 1975

[54] PROCESS FOR PRODUCING NITRIDE FILMS

[75] Inventor: Harold M. Manasevit, Anaheim, Calif.

[73] Assignee: Rockwell International Corporation, El Segundo, Calif.

[22] Filed: June 22, 1970

[21] Appl. No.: 48,558 .

[52] U.S. Cl. ................ 428/539; 156/612; 156/613; 428/538

[51] Int. Cl.².... B32B 9/04; B01D 7/02; B01J 17/32

[58] Field of Search........ 117/106 R, 106 D, 106 A, 117/201, DIG. 10, DIG. 12; 148/174, 175; 23/358; 156/613, 612; 428/538, 539

[56] References Cited

UNITED STATES PATENTS

| | | | |
|---|---|---|---|
| 3,218,205 | 11/1965 | Ruehrwein | 117/106 A X |
| 3,224,913 | 12/1965 | Ruehrwein | 148/174 X |
| 3,462,323 | 8/1969 | Groves | 148/174 X |
| 3,540,926 | 11/1970 | Rairden | 117/201 X |
| 3,565,704 | 2/1971 | Ting Li Chu | 117/106 R X |

FOREIGN PATENTS OR APPLICATIONS

| | | | |
|---|---|---|---|
| 1,134,352 | 11/1968 | United Kingdom | 117/DIG. 12 |

*Primary Examiner*—Cameron K. Weiffenbach
*Attorney, Agent, or Firm*—H. Fredrick Hamann; Robert Ochis; G. Donald Weber, Jr.

[57] ABSTRACT

Appropriate alkyl derivatives of Group III elements are mixed with ammonia or selected alkyl amines. The mixture and/or product of addition are decomposed at a heated substrate to form a nitride semiconductor film. The invention herein described was made in the course of or under a contract or subcontract thereunder, with Army.

3 Claims, No Drawings

PROCESS FOR PRODUCING NITRIDE FILMS

BACKGROUND OF THE INVENTION

1. Field of the Invention

The invention relates to a process for producing nitride films and, more particularly, to such a process in which alkyl derivatives of Group III elements are mixed with selected nitrogen containing compounds followed by a decomposition at a heated substrate.

2. Description of Prior Art

Nitride semiconductor films comprising Group III elements have relatively wide band gap characteristics and possess dielectric, piezoelectric, optical, and chemical properties that are useful for solid state devices, acoustic-type devices and for other applications. The nitride semiconductor materials may also be used to fabricate wide band width semiconductor devices that display high temperature stability. In addition, by combining the nitride semiconductor materials with other piezoelectric materials and insulators, devices can be produced which are acoustically useful in wide band, high-capacity signal and data processing.

Aluminum nitride is a high temperature refractory electrically-insulating material useful as an insulating layer and diffusion mask for other semiconductor materials and devices. Aluminum nitride and gallium nitride semiconductors possess high chemical and thermal stability. As a result, both materials can be used as passivating materials and for diffusion masks. Gallium nitride is transparent to visible radiation and, therefore, may also be used as an invisible luminescent host material.

Various processes have been used to prepare single crystal films of the nitride semiconductor materials including reactive sputtering, gaseous discharge, and chemical vapor deposition. More details on each of the processes can be found by referring to the publications, Vacuum Science and Technology 6, 194 (1969) by A. J. Noreika et al; Physica Status Solidi 3, K71 (1963) by J. Pastrnak and L. Souckova; and Journal of Applied Physics 39, 5578 (1968) by A. J. Noreika and D. W. Ing.

The chemical vapor deposition process has been used more extensively in nitride film foundation and has produced single crystal aluminum nitride films on a number of single crystal substrates such as silicon, silicon carbide and sapphire. Single crystal gallium nitride has also been reported on (0001) oriented sapphire substrate and on (111) gallium arsenide substrates as indicated in the publications, Vacuum Science Technology 6, 593 (1969) by B. B. Kosicki, D. Kahng; and Applied Physics Letters 15, 327 (1969) by H. P. Maruska and J. J. Tietjen.

The process used most often in forming single crystal nitride semiconductors has been the pyrolysis of an ammoniate of a Group III halide, for example, $GaCl_3$: $NH_3$ or $AlCl_3$: $NH_3$ used as either the source material or formed in situ from reactants. In all cases HCl is a by-product of the reaction. The by-product limits the purity of the film since the substrate on which the film is being formed is usually chemically reactive with the hydrogen halides. As a result, impurities are introduced into the gaseous atmosphere and may be reincorporated into the film.

Ideally, a process for forming nitride semiconductor films is preferred that does not involve an etching species. As a result, high quality nitride films could be produced without impurities due to the substrate. It is also preferred that the apparatus for growing the nitride film be relatively simple and compatible with existing commercial apparatuses and facilities. The present process has the preferred features and, in addition, requires only one hot temperature zone as described in more detail subsequently. As a result, a hot-wall reactor normally required can be eliminated.

SUMMARY OF THE INVENTION

Briefly, the invention comprises a process for forming nitride semiconductor films of Group III elements by controlling the pyrolysis of a mixture of gases and/or the reaction product resulting when a selected nitrogen containing compound is mixed with at least one alkyl derivative of the Group III elements. The selected nitrogen containing compound is preferably from the group consisting of ammonia and alkyl amines. The nitride films may be either single or polycrystalline films grown on insulating or semiconductor substrates.

Therefore, it is an object of this invention to provide an improved process for producing nitride films of Group III elements.

It is another object of this invention to provide an improved process for producing single crystal and polycrystalline nitride films of Group III elements on insulating or semiconductor substrates.

It is still another object of this invention to provide an improved process for producing nitride semiconductor films on substrates by controlling the pyrolysis of the mixture and/or product of addition of appropriate alkyl derivatives of the Group III elements with certain nitrogen containing compounds.

A still further object of this invention is to provide an improved process for producing relatively high quality nitride semiconductor films that are free from impurities contributed by the substrate material on which the films are formed.

It is another object of this invention to provide a process for producing a nitride film that does not involve an etching species and which uses a relatively simple apparatus with only one hot temperature zone.

These and other objects of this invention will become more apparent when taken in connection with the description of the preferred embodiments.

DESCRIPTION OF THE PREFERRED EMBODIMENTS

Nitride semiconductor films are produced in one process embodiment by mixing alkyl derivatives of Group III elements with ammonia ($NH_3$) or selected alkyl amines. The mixed gases and/or the solid reaction product are thermally decomposed, or pyrolyzed, under controlled conditions.

In the case where ammonia ($NH_3$) is mixed with the Group III alkyl derivatives, it is in a preferred embodiment maintained in excess over the stoichiometry indicated in the following simplified equation:

$$R_3M + NH_3 \rightarrow \underbrace{R_3M{:}NH_3}_{(A)} , \qquad (1)$$

where R is preferably a low molecular weight alkyl radical such as $CH_3$, $C_2H_5$, etc. A low molecular weight alkyl radical enhances the volatility of the $R_3M$ compound for transport to the reaction zone. The $R_3M$ compound may in reality be a monomer or a polymeric form of $R_3M$. M is a Group III element selected from the group consisting of Al, B, Ga, and In. $NH_3$ in excess helps stabilize the Group III nitride semiconductor film formed by the pyrolysis and assures that all of the metal-organic compound, $R_3M$, has reacted.

Pyrolysis of the reaction product, $R_3M:NH_3(A)$, is done at a temperature consistant with the complete dealkylation of the reaction product A on a suitably crystalline substrate for producing MN in crystalline form. The decomposition and the resulting nitride film are illustrated by the following equation:

$$R_3M:NH_3 \rightarrow MN + 3RH \quad (2)$$

A carrier gas may be used to aid the mixing of the reactants and/or to carry compound A to a heated pedestal. The carrier gas may be an inert gas such as He, $N_2$, Ar or $H_2$. $H_2$ is a preferred carrier gas due to its commercial availability in relatively high purity form.

Alternately, the compound A is formed outside of the reactor portion and then introduced into the reactor. The compound A is then transported under reduced pressure or at atmospheric pressure preferably using a carrier gas, to the heated substrate for decomposition and MN formation. At reduced pressures, a closed-tube-near-equilibrium growth process could be used as well as the open tube film growth process.

The orientation of the deposit of the MN can be controlled by the appropriate choice of the substrate orientation and crystal quality. For example, in one embodiment, a single crystal substrate is preferred which is thermally and chemically stable in the gaseous environment and at the epitaxial growth temperatures of the nitrides.

Although the growth of (0001) AlN and (0001) GaN on (0001) $Al_2O_3$ have been reported in the references previously indicated, certain other orientations have not been reported and are not obvious in view of the reported orientations and processes. For example, nonobvious orientations are $(11\bar{2}0)$ AlN and $(11\bar{2}0)$ GaN on $(01\bar{1}2)$ $Al_2O_3$, the R plane of $Al_2O_3$. The $(11\bar{2}0)$ orientation of these hexagonal semiconductors has the C axis of the crystal in the plane of the substrate and is particularly valuable as a piezoelectric material.

It should be understood that the crystallographic designations are given by way of example and that other crystallographically equivalent planes are also suitable substrates.

The nitride semiconductor films may be on substrates from the classes of crystals comprising rhombohedral, hexagonal and cubic. Sapphire is one example of a rhombohedral crystalline substrate. Silicon carbide and beryllium oxide are examples of hexagonal crystalline substrates. Silicon and spinel are cubic substrates.

The process is illustrated specifically by the following examples which describe various process runs:

EXAMPLE I

AlN on $\alpha$-$Al_2O_3$

A cleaned and polished seed crystal of sapphire (single crystal) was oriented to expose the $(01\bar{1}2)$ plane for film growth and positioned on a pedestal enclosed within a quart reaction tube. The pedestal was rotated in order to aid in film thickness uniformity.

The pedestal was made of silicon carbide-covered carbon material which could be inductively heated by radio-frequency methods. The pedestal was stable in the gaseous environment and at the process temperature. The pedestal was also chemically stable relative to the seed crystal substrate at the processing temperatures. Pedestals of other suitable materials can also be used.

The reactor was first purged of air by evacuation during one test run and by flowing inert gas through the reactor in other test runs. The pedestal was then heated in a flowing inert gas to the deposition temperature, which for the growth of single crystal AlN on $Al_2O_3$ and the growth of single crystal AlN on SiC or Si was in the temperature range of 1200°–1300°C, the temperature as measured on the edge of the pedestal with an optical pyrometer. It was noticed that the temperature of the substrate was less than the temperature measured at the edge of the pedestal due to the cooling caused by the gas flow over the substrate. A temperature difference of as much as 50°–75°C was measured between the deposition area and the edge of the pedestal.

During the test runs, hydrogen carrier gas was passed for about fifteen to 30 minutes over the substrate heated to about 1300°C in order to remove contamination and unwanted surface films by lightly etching the substrate surface. A controlled amount of $NH_3$ in pure and diluted form, depending on the test run, was introduced into the reactor followed by the introduction of trimethylaluminum (TMA). The quantity of the $NH_3$ gas relative to the trimethylaluminum was selected to be in excess of the stoichiometry expressed in the equation 1.

The trimethylaluminum was carried into the reactor by that part of the carrier gas that is bubbled through liquid TMA. Hydrogen was used successfully as a carrier gas. The partical pressure of the trimethylaluminum was controlled by regulating its temperature. In one series of tests, flow rates of 1750 ccpm for $NH_3$ and 25–100 ccpm for $H_2$ bubbled through TMA measured at about 30°C were used. A total carrier gas flow of about 8 liters per minute was used in the growth of a satisfactory film of AlN on $\alpha$-$Al_2O_3$.

The reactants were passed down a 12 millimeter diameter tube situated so that the exit side of the tube was about 5–15 millimeters from the heated substrate. The $NH_3$ and carrier gas for the trimethylaluminum were mixed near the entrance to the tube in some test runs, and in other runs in the tube, for forming the compound A (TMA:$NH_3$). The compound A was then directed towards the heated substrate where the growth of aluminum nitride occurred.

When the $(01\bar{1}2)$ plane of $Al_2O_3$ was exposed to the reactants, the deposit was $(11\bar{2}0)$ aluminum nitride which provided the C axis in the plane of the substrate. Single crystal AlN films formed by the various test runs were high resistivity films. Dopants including hydrogen sulfide, hydrogen selenide, and hydrogen telluride may be added to the reactant gas atmosphere for forming N-type AlN films. The techniques for adding dopants are well known to persons skilled in the art and are not described in detail herein.

A single crystal semiconductor film of AlN was also deposited on silicon and silicon carbide semiconductor substrates using the process described in Example I.

In additional test runs, the substrate temperature was lowered below approximately 1200°C for forming films of different crystallinity. The different crystallinity films may be used as insulating layers, passivating layers and as diffusion masks in semiconductor device processes. Tests indicated that a polycrystalline film of AlN may have dielectric characteristics at least equivalent to either silicon nitride and aluminum oxide in metal nitride semiconductor (MNS) and metal oxide semiconductor (MOS) device structures.

EXAMPLE II

GaN on $\alpha$-$Al_2O_3$ and SiC

Several test runs were conducted to form a single crystal film of gallium nitride (GaN) on various substrates including sapphire, spinel and silicon carbide. The techniques described in connection with the previous example were also used in the present example with the exception that trimethylgallium (TMG) was used instead of trimethylaluminum (TMA).

In the previous example, as well as in this example, the apparatus described in the Journal Electrochem. Society, Volume 116, Page 1726, 1969, by Manasevit and Simpson may be used. However, ammonia should be used in place of arsine and/or phosphine, described in the Journal, in order to form gallium nitride on a suitable substrate.

The temperature of the substrate pedestal was controlled between 900°–975°C. As a result, single crystal films of hexagonal gallium nitride were formed on rhombohedral $\alpha$-$Al_2O_3$ and on hexagonal silicon carbide. The substrate orientation was controlled during the test runs to produce the heteroepitaxial relationships including (0001) GaN parallel to (0001) $Al_2O_3$, (0001) SiC, and (111) spinel, and $(11\bar{2}0)$ gallium nitride parallel $(01\bar{1}2)$ $Al_2O_3$. As in the case of $(11\bar{2}0)$ AlN on $(01\bar{1}2)$ $Al_2O_3$, the C axis of the GaN was in the plane of the substrate.

The structures produced may be used in fabricating acoustic-type devices and may also be applied in delay line technology when the semiconductor films are doped to the proper level. The gallium nitride semiconductor films are n-type and have a low resistivity in the as-grown "undoped" state.

Tests indicated that dilute amounts of alkyl zinc, such as diethyl zinc, can be added to the TMG-$NH_3$ mixtures to grow a high resistivity film of gallium nitride. Other tests were conducted to grow films of InN and BN on substrates by mixing vapors of triethylindium and trimethylindium and trimethylborane and triethylborane, respectively, with ammonia. The reaction product was decomposed on the heated pedestal to produce the semiconductor films.

Relatively low molecular weight alkyl amines, such as monomethyl-, dimethyl-, trimethylamines or amines containing larger alkyl groups such as ethyl-, propyl-, etc., can be used in place of ammonia as a source of nitrogen in producing Group III nitride semiconductor films.

Examples I and II describe processes for forming binary nitride semiconductor films. However, it should be pointed out that by mixing more than one of the appropriate metal-organics of the Group III elements; reacting the metal-organics with ammonia; followed by decomposing the reaction product at an elevated temperature, ternary nitride semiconductor compounds may be produced. The ternary nitride compounds may be represented by the chemical formulas $Ga_{1-x}Al_xN$, $Al_{1-x}B_xN$, $Ga_{1-x}In_xN$, etc. where $x$ may vary from $1 \rightarrow 0$.

Multilayers of nitride semiconductor films may be produced by changing from one metal-alkyl-organic to another metal-alkyl-organic during the growth of the film. In that case, the initial film or films are required to be stable and compatible with the gaseous environment and deposition temperature of the succeeding film. For example, gallium nitride may be grown on aluminum nitride. However, the growth of aluminum nitride on gallium nitride is more difficult due to the instability of the gallium nitride at growth temperatures of about 1200°C.

It should be understood in connection with the above description that the temperature, gas flow rates, film nucleation rates, gas concentrations and other parameters are interrelated. By varying one or more parameters, slightly different epitaxial temperatures may be used.

In addition, although the processes have been described for the formation of nitrides on substrates different from the deposited film, they are equally employable for producing nitrides on substrates comprised of the same chemical constitution as the depositing film, i.e. in homoepitaxial growth, such as AlN on AlN substrate material and GaN on GaN.

I claim:

1. A structure comprising a single crystal sapphire substrate having a $(01\bar{1}2)$ orientation, and a single crystal layer of a compound taken from the group consisting of aluminum nitride, boron nitride, gallium nitride and indium nitride having a $(11\bar{2}0)$ orientation.

2. A structure as described in claim 1 wherein said layer is aluminum nitride.

3. A structure as described in claim 1 wherein said layer is gallium nitride.

* * * * *